United States Patent
Sugiyama et al.

(12) 
(10) Patent No.: US 6,326,667 B1
(45) Date of Patent: Dec. 4, 2001

(54) SEMICONDUCTOR DEVICES AND METHODS FOR PRODUCING SEMICONDUCTOR DEVICES

(75) Inventors: Naoharu Sugiyama; Tomohisa Mizuno; Shinichi Takagi; Atsushi Kurobe, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/658,191

(22) Filed: Sep. 8, 2000

(30) Foreign Application Priority Data

Sep. 9, 1999 (JP) .................................................. 11-255154

(51) Int. Cl.[7] .................................................. H01L 29/72
(52) U.S. Cl. .............................. 257/347; 257/18; 257/19; 257/55; 257/616; 257/617
(58) Field of Search ............................... 257/347, 18, 19, 257/55, 616, 617

(56) References Cited

U.S. PATENT DOCUMENTS 5,461,243   10/1995   Ek et al. .

6,059,895 * 5/2000  Chu et al. ........................... 257/347

FOREIGN PATENT DOCUMENTS 9-321307   12/1997   (JP) .

OTHER PUBLICATIONS

Naoharu Sugiyama et al., U.S. Patent application Ser. No.: 09/468,923, filed Dec. 22, 1999, for Semiconductor Device and Method for Manufacturing the Same.

* cited by examiner

*Primary Examiner*—Edward Wojciechowicz
(74) *Attorney, Agent, or Firm*—Finnegan, Henderson, Farabow, Garrett & Dunner, L.L.P.

(57) ABSTRACT

The invention is intended to form, on an insulating layer, a thin SiGe layer serving as an underlying layer for obtaining a strained silicon layer, and to provide a satisfactory strained Si layer. A SiGe layer 13 is formed on a Si substrate 11 and an oxygen ion implantation is effected with ensuring the detainment within the layer thickness of the SiGe layer 13. The SiGe layer 13 is lattice-relaxed by a heat treatment and a buried insulating layer 15 is formed simultaneously in the SiGe layer 13. A strained Si layer 17 is re-grown on the lattice-relaxed SiGe layer 13.

21 Claims, 5 Drawing Sheets

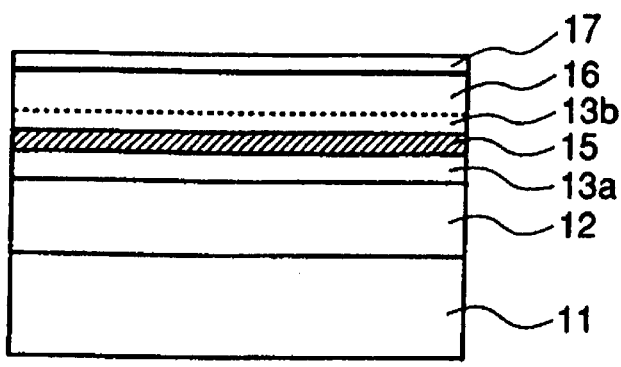
Fig. 4
| Ge (%) | 0 | 10 | 20 | 30 |
|---|---|---|---|---|
| HF (%) | 0.5 | 1 | 1.5 | 2.5 |
Fig. 5
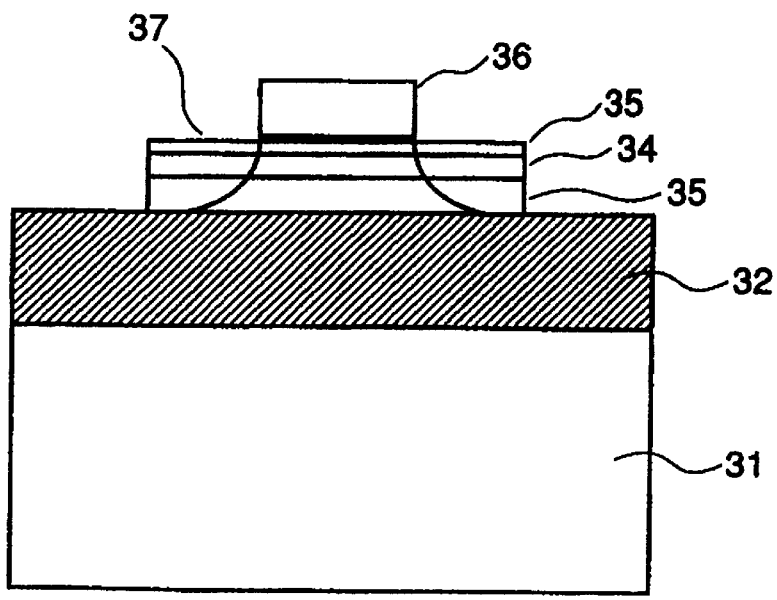
Fig. 6

SEMICONDUCTOR DEVICES AND METHODS FOR PRODUCING SEMICONDUCTOR DEVICES

FIELD OF THE INVENTION

The present invention relates to a semiconductor device having a strained Si layer and a method of producing a semiconductor device having a strained Si layer.

BACKGROUND ART

Various semiconductor devices employing silicon crystals are used widely. To enhance mobility of an electron that runs through a silicon crystal make performance of such a semiconductor device enhance effectively.

However, since the upper limit of the mobility of an electron that runs through a silicon crystal depends on the physical characteristic of a silicon crystal, any change in the structure of a semiconductor device can't change the proper mobility that the silicon crystal has own. Nevertheless, it is reported that the mobility of an electron can be enhanced in a strained silicon crystal that is obtained by straining a usual silicon crystal.

Generally the strained Si layer is produced by growing a thin silicon crystal layer, whose thickness is thinner than the thickness that the crystal is lattice relaxed, on a crystal having a lattice constant that is slightly different from the lattice constant of the silicon crystal. Typically, a SiGe alloy crystal layer whose Ge content is about 20% (where the lattice constant of the SiGe crystal is larger by about 0.8% than the lattice constant of the silicon crystal) is provided as an underlying layer, and then the thin silicon layer having thickness of 100 nm or less on the SiGe layer.

However, because it is difficult to obtain an SiGe crystal substrate which is produced at an industrial large scale and which is not expensive but of a high quality, a silicon wafer is usually employed as a substrate and an SiGe layer is grown by a vapor phase growth on the silicon wafer to a thickness lattice-relaxed (critical film thickness). So, it can obtain a lattice-relaxed SiGe underlying layer.

Nevertheless, Since in this method the SiGe crystal layer whose Ge content is about 20% grows on the Si substrate directly, a lot of defects such as the dislocation that is yielded when the SiGe crystal layer is lattice-relaxed become nucleuses that make the dislocation penetrate to a strained silicon layer growing thereon.

In an attempt to prevent the defects in a SiGe layer upon the lattice relaxation, a buffer layer is formed between a silicon substrate and a lattice-relaxed SiGe layer. Such buffer layer is generally a sufficiently thick SiGe layer having the composition similar to the lattice-relaxed SiGe layer (similar lattice constant) or a gradient SiGe layer having the composition Ge to gradually increase to the lattice-relaxed SiGe layer.

However, since total thickness of the buffer layer and the lattice-relaxed SiGe layer is extremely thick layer, it may make following process difficult. For example, in a case where the devices are integrated, fine devices should be separated from each other, but a SiGe layer having a thickness of 1 μm or more is too thick to separate the devices from each other. Also in an SOI (silicon-on-insulator) technology expected to be capable of reducing the junction capacity, since a SiGe layer (combined with the buffer layer) having a thickness of 1 μm or more is too thick, it makes junction capacity of a device increase.

Thus, it is difficult to obtain a satisfactory strained Si layer unless a thick lattice-relaxed SiGe layer is formed in combination with a buffer layer, so it is difficult to separate devices and to decrease the junction capacity of a device.

SUMMARY OF THE INVENTION

An object of the invention is to provide a semiconductor device and a method of producing a semiconductor device capable of forming a thin lattice-relaxed SiGe layer on an oxide layer and also capable of forming on this lattice-relaxed SiGe layer a satisfactory strained Si layer.

Another object of the invention is to provide a method of producing a semiconductor device capable of re-growing a satisfactory strained Si layer on a lattice-relaxed SiGe layer.

Accordingly, the first aspect of the invention provides a method of producing a semiconductor device comprising the steps of:

forming a strained SiGe layer on a substrate;

introducing oxygen into said strained SiGe layer;

forming an oxide layer by a heat treatment at the position where the oxygen is introduced, so as to make a lattice-relaxed SiGe layer located over said oxide layer; and growing a strained Si layer over said lattice-relaxed SiGe layer.

In this aspect, it is preferable further comprising a step of forming a Si cap layer over said strained SiGe layer, wherein the surface of said strained SiGe layer is protected during said heat treatment.

Also preferred is that a step of growing an SiGe growing layer over said lattice-relaxed SiGe layer is further comprised, and then growing said strained Si layer over said SiGe growing layer.

Also preferred is that a step of etching the surface of said lattice-relaxed SiGe layer is further comprised, and then growing said strained Si layer.

Also preferred is that said oxide layer divides said strained SiGe layer into a SiGe upper layer that formed over said oxide layer and a SiGe lower layer that formed under said oxide layer.

Also preferred is that said introducing oxygen by an oxygen ion implantation under a condition that the oxygen ion is in said strained SiGe layer.

Also preferred is that a step of a HF treatment for terminating the surface of said lattice-relaxed SiGe layer by hydrogen is further comprised, and then growing said strained Si layer.

Also preferred is that said hydrogen on the surface of said lattice-relaxed SiGe layer is removed by a heat treatment, and then growing said strained Si layer.

Also preferred is that the steps of forming an oxide layer on the surface of said lattice-relaxed SiGe layer and removing said oxide layer by a heat treatment under vacuum are further comprised, and then growing said strained Si layer.

Also preferred is that a step of forming a SiGe buffer layer on said substrate is further comprised, and then forming said strained SiGe layer on said SiGe buffer layer.

Also preferred is that said substrate is a Si substrate.

Also preferred is that said substrate is a silicon-on-insulator substrate.

According to the first aspect of the invention, oxygen atoms are introduced into the strained SiGe layer and then the oxide layer is formed in the strained SiGe layer by heat treatment. The oxide layer divides the strained SiGe layer into a lattice-relaxed SiGe upper layer and a lattice-relaxed SiGe lower layer. A layer thickness of the lattice-relaxed SiGe upper layer becomes thicker by controlling the projection range of the oxygen ion implantation. Since the strain of the strained SiGe layer is relaxed into the oxide layer during the heat treatment, a defect such as a dislocation does not occur upon the lattice relaxation of the SiGe layer.

A second aspect of the invention provides a method of producing a semiconductor device comprising the steps of:
  forming a lattice-relaxed SiGe layer on an insulating layer;
  a HF treatment for terminating the surface of said lattice-relaxed SiGe layer by hydrogen; and
  growing a strained Si layer on the surface of said lattice-relaxed SiGe layer.

In this aspect, it is preferred further comprising a step of removing a part of the surface of said lattice-relaxed SiGe layer, and then terminating said hydrogen on the surface of said lattice-relaxed SiGe layer.

Also preferred is that a step of removing said hydrogen on the surface of said lattice-relaxed SiGe layer by a heat treatment is further comprised, and then growing said strained Si layer.

Also preferred is that a step of growing a SiGe growing layer on said lattice-relaxed SiGe layer is further comprised, and then growing said strained Si layer on said SiGe growing layer.

According to the second aspect of the invention, since terminating the hydrogen protects the surface of the lattice-relaxed SiGe layer and then the strained Si layer grows on the surface of the lattice-relaxed SiGe after removing the hydrogen, the strained Si layer can grow in the better condition.

The third aspect of the invention provides a method of producing a semiconductor device comprising the steps of:
  forming a lattice-relaxed SiGe layer on an insulating layer;
  forming an oxide layer on the surface of said lattice-relaxed SiGe layer;
  removing said oxide layer by a heat treatment under vacuum; and
  growing a strained Si layer on the surface of said lattice-relaxed SiGe layer.

In this aspect, it is preferred further comprising a step of removing a part of the surface of said lattice-relaxed SiGe layer, and then forming said oxide layer on the surface of said lattice-relaxed SiGe layer.

Also preferred is that a step of growing a SiGe growing layer on said lattice-relaxed SiGe layer after removing said oxide layer is further comprised, and then growing said strained Si layer on said SiGe growing layer.

According to the third aspect of the invention, since the oxide layer protects the surface of the lattice-relaxed SiGe layer and then the strained Si layer grows on the surface of the lattice-relaxed SiGe after removing the oxide layer, the strained Si layer can grows in the better condition.

The fourth aspect of the invention provides a semiconductor device comprising:
  a substrate;
  a first SiGe layer formed on the substrate;
  an oxide layer formed on said first SiGe layer;
  a second SiGe layer formed on said oxide layer, wherein said second SiGe layer is lattice-relaxed and has a thickness of 200 nm or less;
  a strained Si layer formed on said second SiGe layer.

In this aspect, it is preferred that said second SiGe layer has a thickness of 20 nm or less.

BRIEF DESCRIPTION OF THE DRAWINGS

FIG. 4 shows a sectional view illustrating a method of producing a multilayered structure of strained Si/lattice-relaxed SiGe/insulating layers according to the invention.

FIG. 5 is a table showing the condition of the lattice-relaxed SiGe layer surface treatment upon producing a strained Si/lattice-relaxed SiGe/insulating layer structure according to the invention.

FIG. 6 is a sectional view of MOSFET using a multilayered structure of strained Si/lattice-relaxed SiGe/insulating layers according to the invention.

DESCRIPTION OF THE PREFERRED EMBODIMENTS

Figure 1:
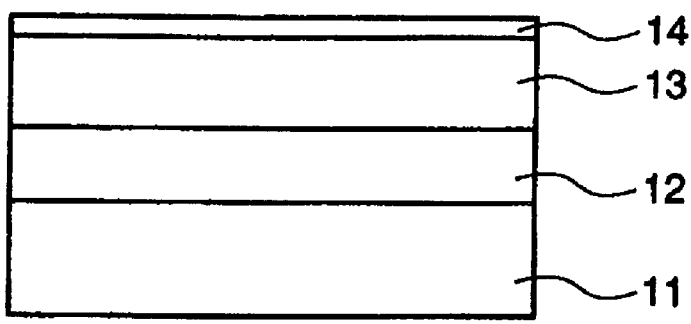
FIG. 1 shows a sectional view illustrating a method of producing a multilayered structure of strained Si/lattice-relaxed SiGe/insulating layers according to the invention.

Preferred embodiments of the invention is detailed below with referring to the drawings (Embodiment 1)

As shown in FIG. 1, an ultra high vacuum CVD (chemical vapor deposition) apparatus is used to grow a $Si_{1-x}Ge_x$ gradient composition layer 12 on a p-type Si substrate 11. This p-type Si substrate 11 has a specific resistance of 4.5 Ωcm to 6 Ωcm and its main surface is a (100) surface. The film thickness of $Si_{1-x}Ge_x$ gradient composition layer 12 is 1800 nm, the Ge content X is increased 0 to 2 gradually from the start to the end of growth. This Si1−xGex gradient composition layer 12 serves as a buffer layer.

The source gases for the $Si_{1-x}Ge_x$ gradient composition layer 12 are $Si_2H_6$ and $GeH_4$, with no added dopant. The substrate temperature is at 650° C., the $Si_2H_6$ source gas partial pressure is at 30 mPa and the $GeH_4$ source gas partial pressure gradually increases up to 60 mPa to obtain a gradient composition. Increasing the flow rate setting stepwise can increase the $GeH_4$ source gas partial pressure. On the other hands, 200 nm thickness of the $Si_{1-x}Ge_x$ layers differing in the Ge content X stepwise by 2% from 2% to 18% may be laminated to form a $Si_{1-x}Ge_x$ gradient composition layer 12 having thickness of approximately 1800 nm.

A strained $Si_{1-x}Ge_x$ layer 13 is then grown on the $Si_{1-x}Ge_x$ (X:0→0.2) gradient composition layer 12 using the ultra high vacuum CVD device. The Ge content X of the strained $Si_{1-x}Ge_x$ layer 13 is constant at 0.2 from the beginning to the end of growth and the layer thickness is 1000 nm. While the strained $Si_{0.8}Ge_{0.2}$ layer 13 is partly strained due to the layer thickness thereof and also due to the layer thickness of the underlying $Si_{1-x}Ge_x$ (S:0→0.2) gradient composition layer 12, it may partly be relaxed. The $Si_{1-x}Ge_x$ (X:0→0.2) gradient composition layer 12 serves as a buffer layer to suppress a penetrating dislocation in the strained $Si_{0.8}Ge_{0.2}$ layer 13.

The source gases for the strained $Si_{0.8}Ge_{0.2}$ layer 13 are $Si_2H_6$ and $GeH_4$, with no added dopant. The substrate temperature is at 650° C. with the $Si_2H_6$ source gas partial pressure of 30 mPa and the $GeH_4$ source gas partial pressure of 60 mPa.

A Si cap layer 14 is then formed to the layer thickness of 30 nm continuously on the strained $Si_{0.8}Ge_{0.2}$ layer 13 using the ultra high vacuum CVD apparatus.

The source gas for the Si cap layer 14 is $Si_2H_6$, with no added dopant. The substrate temperature is at 650° C. with the $Si_2H_6$ source gas partial pressure of 30 mPa.

Figure 2:
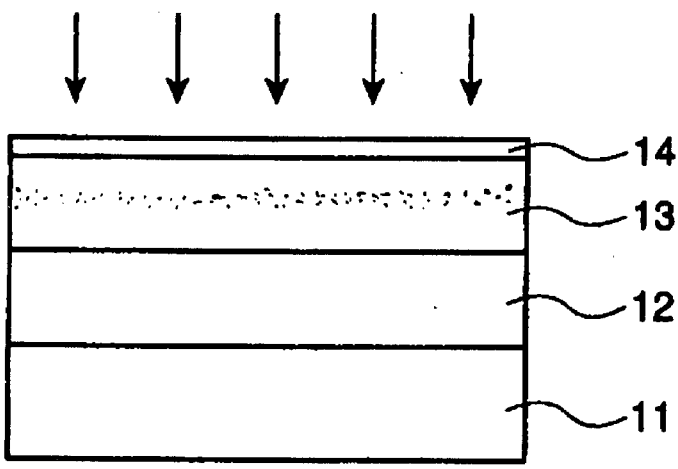
FIG. 2 shows a sectional view illustrating a method of producing a multilayered structure of strained Si/lattice-relaxed SiGe/insulating layers according to the invention.

As shown in FIG. 2, the substrate is then transferred from the ultra high vacuum CVD apparatus to an ion implantation apparatus, where the oxygen ion is implanted. In this process, the oxygen ion is implanted under a condition to locate the oxygen in the strained $Si_{0.8}Ge_{0.2}$ layer 13 (1000 nm) to ensure that the oxygen ion is retained in the strained $Si_{0.8}Ge_{0.2}$ layer 13. For this purpose, the acceleration energy is 180 keV and the implantation dose is $4\times10^{17}$ $cm^{-2}$. This energy gives the projection range of 400 nm with the fluctuation of ±100 nm.

The depth at which the buried oxide layer is formed can be adjusted by altering the accelerating energy. For example, a higher accelerating energy gives a deeper position of the buried oxidizing layer. On the other hand, a lower accelerating energy gives a shallower position of the buried oxidizing layer. It should be noted that a too lower accelerating energy makes the oxygen distributed toward the surface of the strained $Si_{0.8}Ge_{0.2}$ layer 13 since the projection range fluctuates ±100 nm. Typically, the accelerating energy is preferably 25 keV or higher. It prefers that the range of depth that the oxygen ion located is 150 nm or more and 600 nm or less from the surface of the strained $Si_{0.8}Ge_{0.2}$ layer 13.

Figure 3:
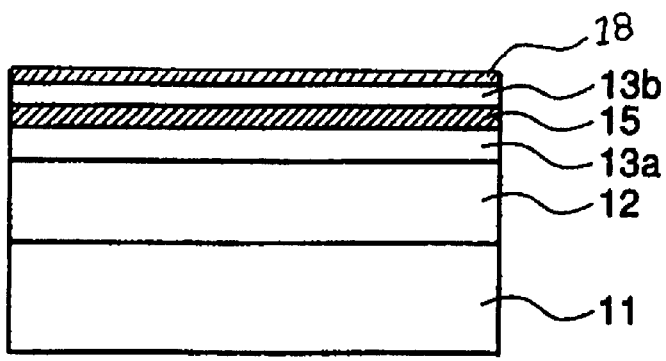
FIG. 3 shows a sectional view illustrating a method of producing a multilayered structure of strained Si/lattice-relaxed SiGe/insulating layers according to the invention.

As shown in FIG. 3, the substrate is then taken out from the ion implantation apparatus and subjected to a heat treatment at 1350° C. for 4 hours. As a result of this heat treatment, a buried oxide layer 15 having thickness of 100 nm is formed mainly at the depth of 400 nm from the surface. This buried oxide layer 5 divides the strained $Si_{0.8}Ge_{0.2}$ layer 13 into a $Si_{1-x}Ge_x$ lower layer 13a and a $Si_{1-x}Ge_x$ upper layer 13b. Also as a result of the heat treatment, the $Si_{1-x}Ge_x$ upper layer 13b is lattice-relaxed.

The most important parameter in this heat treatment is the temperature setting. A SiGe layer should be ion-implanted and annealed to lattice-relax at a somewhat low temperature because it deteriorate the surface of the SiGe layer such as rough surface by a high heat load process. For example, a temperature of 1200° C. to 1350° C. is preferable.

During this heat treatment, the surface condition of the strained $Si_{0.8}Ge_{0.2}$ layer 13 can be kept satisfactory by changing the crystal surface of the Si cap layer 14 to a thin oxidizing layer 18. Accordingly, it is effective to add a small amount of an oxygen gas into an atmosphere of the heat treatment.

For example, when a heat treatment atmosphere may employ an inert gas such as an argon gas to which an oxygen gas is introduced at about 0.5%, the heat treatment simultaneously forms a thin oxide layer on the surface of the Si cap layer 14. The inert gas employed here may also be a rare gas or nitrogen instead of argon.

While the layer thickness of the Si cap layer 14 employed here is 30 nm, it is acceptable that it annealed under the condition that the surface oxide layer 18 is formed to a thickness less than 30 nm. The non-oxidized Si layer, which is lower layer of the Si layer 14, changes a SiGe layer, into which Ge atoms are diffused from the underlying $Si_{0.8}Ge_{0.2}$ layer 13. The SiGe layer is lattice-relaxed. So, it's no problem.

Also when the heat treatment is given without forming the Si cap layer 14, it is preferable to oxidize the surface of the $Si_{0.8}Ge_{0.2}$ layer 13 slightly in an atmosphere with small amount of oxygen gas to ensure a satisfactory surface condition of the $Si_{0.8}Ge_{0.2}$ layer 13. This oxide layer is removed by an etching in a subsequent process.

The buried oxide layer 15 formed in this heat treatment contains almost no Ge content, which is diffused into the $Si_{1-x}Ge_x$ lower layer 13a and the $Si1-xGex$ upper layer 13b. As a result, the buried oxide layer 15 becomes a $SiO_x$.

On the other hand, this heat treatment makes the $Si_{1-x}Ge_x$ lower layer 13a have a Ge content X which is lower slightly than 0.2 as a result of the diffusion of Ge to the $Si_{1-x}Ge_x$ (X:0 → 0.2) buffer layer 12.

Also upon the lattice relaxation of the $Si_{1-x}Ge_x$ upper layer 13b, since the strain energy is released toward the amorphous buried oxide layer 15 instead of the $Si_{1-x}Ge_x$ lower layer 13a, a thin lattice-relaxed $Si_{1-x}Ge_x$ upper layer 13b can be obtained without any new dislocation.

The silicon oxide layer 18 formed on the surface of the Si cap layer 14 is then etched off by hydrofluoric acid or ammonium fluoride.

A non-oxidized portion of the Si cap layer 14 and the surface of the $Si_{1-x}Ge_x$ upper layer 13b are then etched off by an $HF+HNO_3$-based etchant. As a result, a satisfactory surface of the lattice-relaxed $Si_{1-x}Ge_x$ upper layer 13b can be obtained.

In this process, the $HF+HNO_3$-based etchant has the composition of $HF:H_2O:HNO_3=1:20:50$, and the etching rate at room temperature is 600 nm/min for Si and 1300 nm/min for $Si_{0.8}Ge_{0.2}$. Reducing the concentration of hydrofluoric acid or nitric acid can reduce the etching rate further. For example, $Si_{0.8}Ge_{0.2}$ is etched with $HF:H_2O:HNO_3=1:100:500$ at 70 nm/min.

Although etching the surface of the lattice-relaxed $Si_{1-x}Ge_x$ upper layer 13b is not necessary always, it is desirable for the purpose of a thinner SiGe layer formed on the buried oxide layer 15. This etching can reduce the thickness of the lattice-relaxed $Si_{1-x}Ge_x$ upper layer 13b to 100 nm or less, more preferably as thin as 5 nm to 10 nm.

The etched surface of the lattice-relaxed $Si_{1-x}Ge_x$ upper layer 13b is hydrogen-terminated by hydrofluoric acid (HF) solution treatment.

Since the surface of the lattice-relaxed $Si_{1-x}Ge_x$ upper layer 13b once etched here is now exposed to an atmosphere, the surface of the lattice-relaxed $Si_{1-x}Ge_x$ upper layer 13b is oxidized with atmospheric moisture or oxygen or tends to be contaminated unless hydrogen-terminating. Accordingly, a protecting layer is formed by terminating hydrogen on the surface of the lattice-relaxed $Si_{1-x}Ge_x$ upper layer 13b to ensure to protect from the oxidation or contamination. As a result, a satisfactory strained Si layer can be formed on the lattice-relaxed $Si_{1-x}Ge_x$ upper layer 13b upon re-growing the strained Si layer subsequently.

As shown in FIG. 4, the substrate is then placed again in the ultra high vacuum CVD apparatus, and hydrogen and impurities on the surface of the lattice-relaxed $Si_{1-x}Ge_x$ upper layer 13b terminated by hydrogen are removed by a heat treatment.

A lattice-relaxed $Si_{0.8}Ge_{0.2}$ layer 16 is then grown to the layer thickness of 100 nm on lattice-relaxed $Si_{1-x}Ge_x$ upper layer 13b using the ultra high vacuum CVD apparatus. The source gases for the lattice-relaxed $Si_{0.8}Ge_{0.2}$ layer 16 were $Si_2H_6$ and $GeH_4$. The substrate temperature is at 650° C. with the $Si_2H_6$ source gas partial pressure of 30 mPa and the $GeH_4$ source gas partial pressure of 60 mPa.

A strained Si layer 17 is then formed to the layer thickness of 20 nm on the lattice-relaxed $Si_{0.8}Ge_{0.2}$ layer 16 using the ultra high vacuum CVD apparatus. The source gas for the strained Si layer 17 is $Si_2H_6$. The substrate temperature is at 650° C. with the $Si_2H_6$ source gas partial pressure of 30 mPa.

In this process, a strained Si layer 17 having a further satisfactory crystal structure can be formed on the $Si_{0.8}Ge_{0.2}$ buffer layer 16 instead of forming a strained Si layer 17 directly on the lattice-relaxed $Si_{1-x}Ge_x$ upper layer 13b. It is a matter of course that a strained Si layer 17 may be formed directly on the lattice-relaxed $Si_{1-x}Ge_x$ upper layer 13b.

It is desirable that the total layer thickness of the lattice-relaxed $Si_{0.8}Ge_{0.2}$ buffer layer 16 and the lattice-relaxed $Si_{1-x}Ge_x$ upper layer 13b is 200 nm or less, more preferably 10 nm or less.

The layer thickness of the strained Si layer 17 is preferably 30 nm or less, more preferably 5 nm to 10 nm.

Thus, the lattice-relaxed thin $Si_{1-x}Ge_x$ layer 13b and 16 can be formed on the buried oxide layer 15 and the satisfactory strained Si layer 17 can be formed on the lattice-relaxed SiGe layer. The electron mobility in the strained Si layer thus formed is about 1.76 times that in a strain-free Si layer. In the case of forming a device, it is possible that the device is formed over the buried oxide layer 15. On the other hands, the buffer layer 12 is located under the buried oxide layer 15, so the buffer layer 12 does not need to be separated from each other. The forming process of the device is described in the embodiment 4.

FIG. 5 shows the relationship between the lowest concentration of an HF solution required in the hydrogen terminating treatment and the Ge content X of the lattice-relaxed $Si_{1-x}Ge_x$ upper layer 13b to be treated discussed in this embodiment. In this experiment, the substrates differing from each other in the Ge content X of the lattice-relaxed $Si_{1-x}Gex$ upper layer 13b, which was 0%, 10%, 20% or 30%, were provided. The hydrogen terminates on the surface of the lattice-relaxed $Si_{1-x}Ge_x$ upper layer 13b at varying HF concentration in the solution of hydrofluoric acid.

The HF concentration indicated here is a desirable lowest value. If HF solution less than HF concentration in the FIG. 5 is used, it can't remove oxygen impurities on the surface of the lattice-relaxed $Si_{1-x}Ge_x$ upper layer 13b sufficiently since it can't hydrogen-terminate on the surface sufficiently. So it is possible that the impurities are remained in the interface between re-growing layer ant the lattice-relaxed layer or the crystal quality of the re-grown layer is deteriorated after re-growing process.

Thus it is preferable to employ a high HF concentration in the hydrogen terminating treatment, such as, for example, 1.5% or higher when the Ge content X of the lattice-relaxed $Si_{1-x}Ge_x$ upper layer 13b is 20%.

The re-growing temperature can readily be adjusted since the hydrogen-terminated surface of the lattice-relaxed $Si_{1-x}Ge_x$ upper layer 13b begins to release hydrogen at 400° C. to 500° C.

In order to ensure to remove oxygen or carbon impurities remained in trace amounts on the surface, a heat treatment at 850° C. to 900° C., in addition to the hydrogen release at 400° C. to 500° C., is further desirable. However, the surface of the lattice-relaxed $Si_{1-x}Ge_x$ upper layer 13b may deteriorate such as causing a rough surface at a high temperature for a long period, since SiGe is susceptible to a heat treatment at a high temperature. Accordingly, the heat treatment for removing oxygen or carbon impurities without causing any surface deterioration of the lattice-relaxed $Si_{1-x}Ge_x$ upper layer 13b whose Ge content is 20% is conducted preferably at 850° C. for 20 minutes or shorter, or at 900° C. for 5 minutes or shorter.

(Embodiment 2)

In this embodiment, an oxide layer is formed as a protecting layer on the surface of the lattice-relaxed $Si_{1-x}Ge_x$ upper layer 13b instead of the hydrogen termination for layer protection.

Accordingly, the processes from FIG. 1 to FIG. 3 are similar to those in Embodiment 1 and thus are not described below.

After a part of the surface of the lattice-relaxed $Si_{1-x}Ge_x$ upper layer 13b is etched off as described in Embodiment 1, the surface of the lattice-relaxed $Si_{1-x}Ge_x$ layer 13b is oxidized to form an oxide layer (protecting layer). The thickness of such oxide layer is preferably 3 nm or less, more preferably 1.5 nm or less. This oxidation is conducted effectively by an acid reagent treatment using a mixture of hydrochloric acid and hydrogen peroxide. For example, a mixture of hydrochloric acid:hydrogen peroxide:water (about 1:1:6) heated at 90° C. or higher provides a satisfactory oxide layer.

The substrate is then placed in the ultra high vacuum CVD apparatus, and the oxide layer as a protecting layer is removed by heating under vacuum.

The heat treatment for removing the oxide layer is preferably 850° C. to 900° C. While the heat treatment there for removing the oxide layer should be a greater heat load than in the case of the hydrogen termination, a heat treatment at 850° C. for 30 minutes or shorter is preferable typically when handling a lattice-relaxed $Si_{1-x}Ge_x$ layer whose Ge content is 20%.

As shown in FIG. 4, a lattice-relaxed $Si_{0.8}Ge_{0.2}$ layer 16 is then grown to the layer thickness of 100 nm on the lattice-relaxed $Si_{1-x}Gex$ upper layer 13 whose oxide layer has been removed using the ultra high vacuum CVD apparatus. The source gases for the lattice-relaxed $Si_{0.8}Ge_{0.2}$ layer 16 are $Si_2H_6$ and $GeH_4$. The substrate temperature is at 650° C. with the $Si_2H_6$ source gas partial pressure of 30 mPa and the $GeH_4$ source gas partial pressure of 60 mPa.

A strained Si layer 17 is then formed to the layer thickness of 20 nm on the lattice-relaxed $Si_{0.8}Ge_{0.2}$ layer 16 using the ultra high vacuum CVD apparatus. The source gas for the strained Si layer 17 is $Si_2H_6$. The substrate temperature is at 650° C. with the $Si_2H_6$ source gas partial pressure of 30 mPa.

In this process, a strained Si layer 17 having a further satisfactory crystal structure can be formed on an $Si_{0.8}Ge_{0.2}$ buffer layer 16 instead of forming a strained Si layer directly on the lattice-relaxed $Si_{1-x}Ge_x$ upper layer 13b. It is a matter of course that a strained Si layer 17 may be formed directly on the lattice-relaxed $Si_{1-x}Ge_x$ upper layer 13b.

It is desirable that the total layer thickness of the lattice-relaxed $Si_{0.8}Ge_{0.2}$ buffer layer 16 and the lattice-relaxed $Si_{1-x}Ge_x$ upper layer 13b is 200 nm or less, more preferably 10 nm or less.

The layer thickness of the strained Si layer 17 is preferably 30 nm or less, more preferably 5 nm to 10 nm.

Thus, the lattice-relaxed thin $Si_{1-x}Ge_x$ layer 13b and SiGe buffer layer 16 can be formed on the buried oxide layer 15, and the strained Si layer 17 can be formed on the lattice-relaxed thin SiGe layer.

(Embodiment 3)

Figure 7:
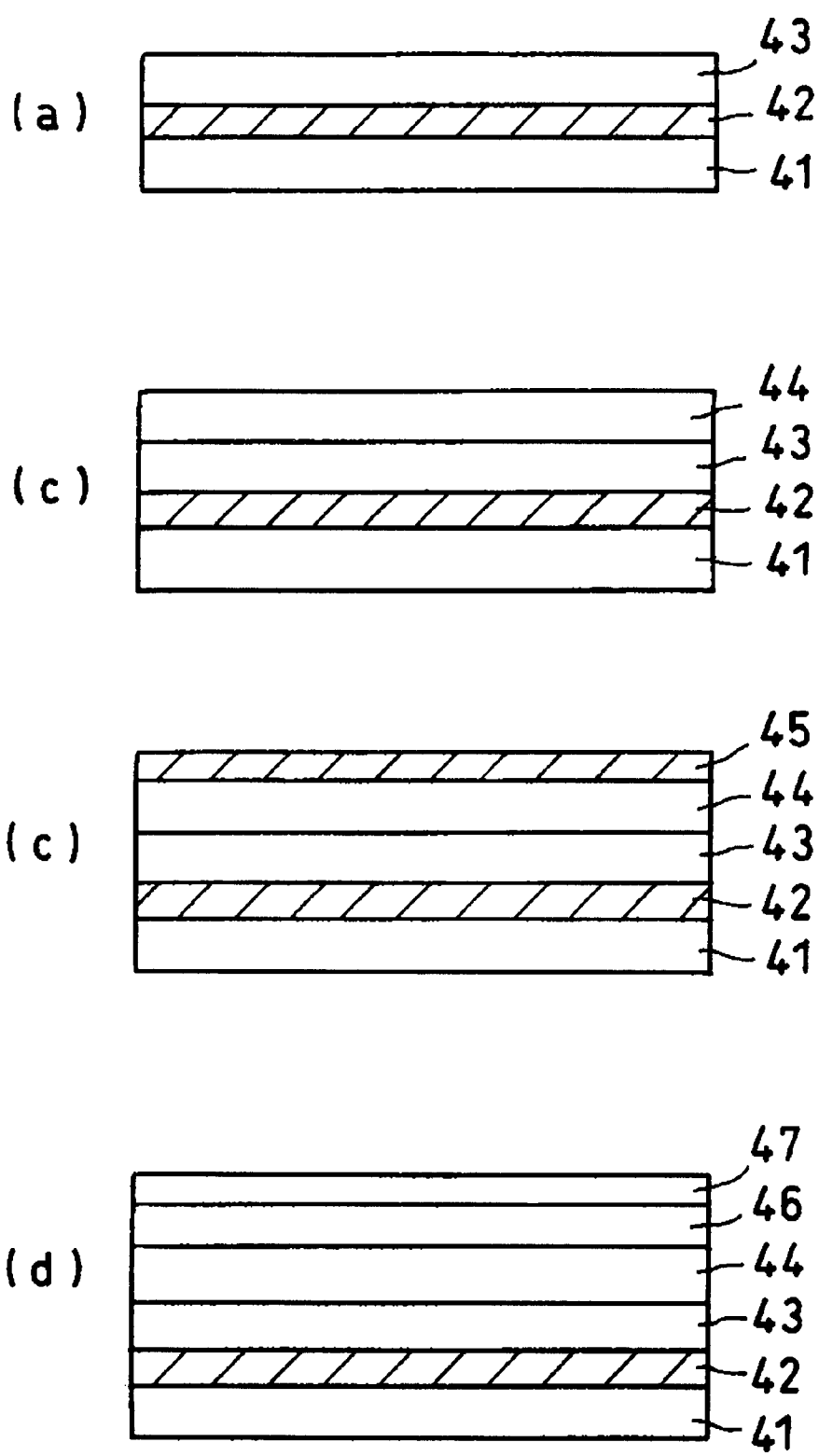
FIG. 7 shows a sectional view in each process illustrating a method of producing a multilayered structure of strained Si/lattice-relaxed SiGe/insulating layers according to the invention.

FIG. 7 shows the process for producing a semiconductor device described in Embodiment 3 of the invention. This embodiment 3 is the second aspect of the invention.

This embodiment employs an SOI (silicon-on-insulator) substrate, and a strained SiGe layer is grown by an epitaxial growth on an SOI layer to form a lattice-relaxed SiGe layer.

First of all, an SOI substrate in which a silicon substrate 41 is mounted with a silicon oxide layer 42 whose thickness is 100 nm and a silicon single crystal layer 43 whose thickness is 20 nm in this order is provided as shown in FIG. 7(a).

Such SOI substrate is manufactured industrially and readily available, but a commercial low price SOI substrate frequently has a too thick silicon single crystal layer 43 whose thickness is 100 nm or more. Such silicon single crystal layer 43 may be oxidized in an ordinary heat oxidation furnace to make the SOI layer 43 (Si layer on a buried oxide layer 42) thinner. When the surface of an SOI layer 43, for example, whose initial thickness is 100 nm is oxidized under a condition that an oxide layer about 160 nm can be formed, an SOI layer about 20 nm remains. In this case, the surface oxide film is removed by etching.

The following description concerns to a growth of $Si_{0.85}Ge_{0.15}$ layer 44 (Ge content: 15%) whose layer thickness is 100 nm on the SOI substrate described above at a low temperature around 500° C. shown in FIG. 7(b). To accomplish such growth at a low temperature, an MBE (molecular beam epitaxy) method employing a solid material is also useful similarly to the ultra high vacuum CVD method described in Embodiments 1 and 2. In this embodiment, an MBE method employing a solid material is discussed.

In the MBE method employing a solid material, an electron beam irradiates to a Si source to heat it and a Si vapor is supplied onto a substrate heated by a separate heat source (substrate heater). At the same time, a Ge vapor taken out of a Ge source heated by a furnace is supplied onto the substrate simultaneously, whereby forming a SiGe crystal layer. In this process, the temperatures of the Si source and the Ge source may be controlled to adjust the both vapor pressures, whereby devising a predetermined Ge composition.

The MBE method is employed to grow a $Si_{0.85}Ge_{0.15}$ layer 44 (Ge content: 15%) to the thickness of 100 nm on the SOI layer 43 at a low temperature around 500° C.

After growing this $Si_{0.85}Ge_{0.15}$ layer 44, the $Si_{0.85}Ge_{0.15}$ layer 44 has a tensile strain due to a Si crystal layer 43.

As shown in FIG. 7(c), this substrate is taken out into an atmosphere and then placed in a heat treatment furnace, where it is annealed at a temperature as high as 1100° C. for 1 hours. By taking out into an atmosphere, a very thin oxide layer 45 is formed on the surface of the $Si_{0.85}Ge_{0.15}$ layer 44 and serves to suppress the precipitation or aggregation of Ge atom in a heat treatment. This heat treatment slides dislocation between the buried oxide layer 42 and the underlying SOI layer 43, and then the $Si_{0.85}Ge_{0.15}$ layer 44 is lattice-relaxed.

Since an Si oxide layer 45 is formed on the surface of the lattice-relaxed SiGe layer 44 after each process, this surface oxide layer is removed by an HF treatment simultaneously with a hydrogen termination of the surface of the lattice-relaxed SiGe layer 44 by the HF treatment. The condition of the HF treatment is similar to that in Embodiment 1.

As shown in FIG. 7(d), this substrate is placed in the thin film growing apparatus, where the lattice-relaxed SiGe layer 46 is re-grown to ensure the crystal quality and a strained Si layer 47 is formed on the top. As a result, a multilayer structure of strained Si layer 47/$Si_{1-x}Ge_x$ layer 46, 44/Si layer 43/Si oxide layer 42 is obtained. The structure thus obtained diffuses Ge atoms into the initial SOI layer from the subsequently formed SiGe layer 46 when the heat treatment temperature is high, so it results in a reduced Ge concentration on average, which is 12.5% in the case discussed above.

While in this embodiment it anneals the substrate, next it hydrogen-terminates the surface of the SiGe layer 44, and then it grows the strained Si layer 47, it can be that it anneals the substrate, next it etches a part of the surface of the lattice-relaxed SiGe layer 44, and then it hydrogen-terminates the etched surface of the SiGe layer 44, next it grows the strained Si layer 47. So an extremely thin lattice-relaxed SiGe layer 44 whose thickness was 120 nm and whose Ge content is 12.5% formed after the heat treatment as described above may be etched off by 90 nm from the surface to reduce the layer thickness to 30 nm, and the strained Si layer 47 whose layer thickness is 15 nm may be re-grown.

Also in this manner, a high temperature heat treatment is required to obtain a satisfactory lattice-relaxed SiGe layer 44, resulting in the oxidation of the surface layer. Even if a Si cap layer 14 protects the surface, a large amount of Ge is migrated from the SiGe layer and prevents the Si layer from being preserved. Thus, in order to obtain a strained Si layer finally as a top layer, the re-growing process after the high temperature heat treatment is essential.

(Embodiment 4)

An example of an MOSFET produced using the multilayer structure obtained as described above is described below.

As shown in FIG. 6, a Si substrate 31 is mounted with a buried oxide layer 32. A lattice-relaxed SiGe layer 35, a strained Si layer 34, a gate oxide layer 35 and a gate electrode 36 are formed on the buried oxide layer 32. A source-drain 37 is formed in the strained Si layer 34 at the both sides of the gate electrode 36.

The Ge content and the thickness of the lattice-relaxed $Si_{0.7}Ge_{0.3}$ layer 35 employed here are 30% and 7 nm, respectively, and the initial thickness of the strained Si layer 34 is 6 nm. A 3 nm oxide layer and a 4.5 nm strained Si layer 34 are laminated on the relaxed SiGe/insulating layer (buried oxide layer) after completing the MOSFET, because the surface of the strained Si layer 34 is heat-oxidized as the gate oxide layer.

A method of producing this MOSFET is described below with referring to FIG. 8 and FIG. 9.

As shown in FIG. 8(a), it grows a SiGe gradient composition layer 82 (2.5 μm in thickness) having increasing Ge content on a Si substrate. It grows $Si_{0.7}Ge_{0.3}$ layer 83 whose thickness is 2 μm on the SiGe gradient composition layer 82. It grows a Si cap layer 84 whose thickness is 20 nm on the $Si_{0.7}Ge_{0.3}$ layer 83. These layers are formed by the ultra high vacuum CVD method starting from $Si_2H_6$ and $GeH_4$.

Then as shown in FIG. 8(b) the multilayer substrate is subjected to an oxygen ion implantation. The accelerating energy here is 180 keV with the injection dose of $4 \times 10^{17}$ $cm^{-2}$.

The substrate is annealed at 1350° C. for 4 hours. As a result of this heat treatment, a buried oxide layer 85 whose thickness is 100 nm is formed mainly at the depth of 400 nm from the surface. This buried oxide layer 85 is located between the $Si_{0.7}Ge_{0.3}$ layer 83 and the SiGe gradient composition layer 82. Also as a result of this heat treatment, the $Si_{0.7}Ge_{0.3}$ layer 83 is lattice-relaxed.

Then as shown in FIG. 8(c) the surface of the $Si_{0.7}Ge_{0.3}$ layer 83 whose thickness is 400 nm is etched to 7 nm with an HF:nitric acid solution mixture. In this process, the Si cap layer 84 is also etched. Other etching methods may also be employed here.

Figure 8:
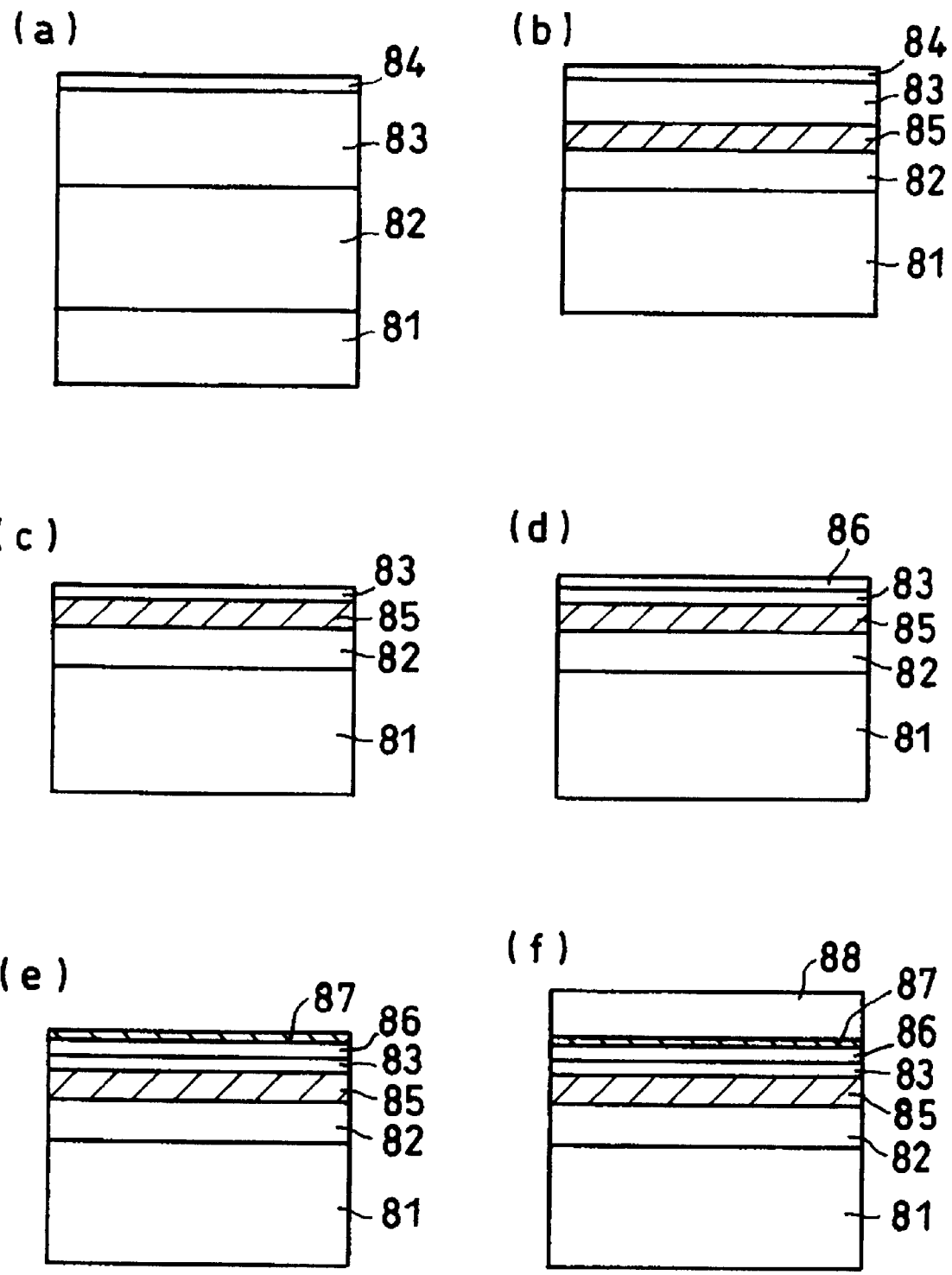
FIG. 8 shows a sectional view in each process illustrating a method of producing an MOSFET using a multilayered structure of strained Si/lattice-relaxed SiGe/insulating layers according to the invention.

Then as shown in FIG. 8(*d*) it forms a strained Si layer 86 whose thickness is 6 nm on the $Si_{0.7}Ge_{0.3}$ layer 83 by the CVD apparatus.

Then as shown in FIG. 8(*e*) the surface of the strained Si layer 86 is heat-oxidized. The layer thickness of a heat oxide layer 87 thus formed is 3 nm, resulting in a 3 nm oxide layer 87 and a 4.5 nm strained Si layer 86.

Then as shown in FIG. 8(*f*) a polycrystalline Si layer 88 whose thickness is 50 nm is formed on the oxide layer 87.

Figure 9:
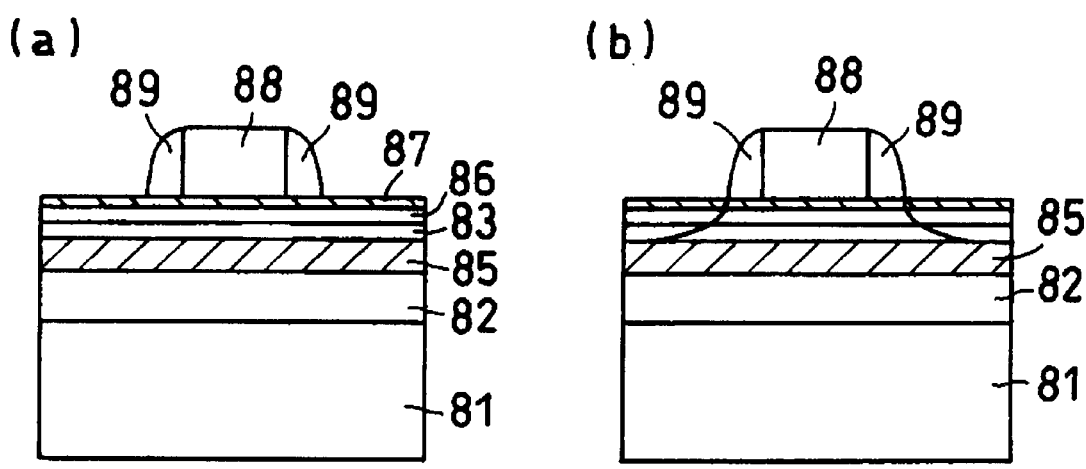
FIG. 9 shows a sectional view in each process illustrating a method of producing an MOSFET using a multilayered structure of strained Si/lattice-relaxed SiGe/insulating layers according to the invention.

Then as shown in FIG. 9(*a*) the polycrystalline Si layer 88 is etched off except for the gate region and form a gate electrode 88. It forms an insulating layer on the substrate and the insulating layer is etched off except for the side of the gate electrode 88 by RIE to form gate sidewall 89.

Then as shown in FIG. 9(*b*) the polycrystal Si gate electrode 88 and the source-drain region 90 at the both ends of the gate 88 are imparted with low resistances by an impurity ion implantation and a rapid thermal anneal. The rapid thermal anneal after the ion implantation is conducted preferably at a temperature not higher than 850° C. A higher temperature may relax the strained Si layer 86. Also a higher temperature may deteriorate the Si/SiGe interface for diffusing Ge.

Finally, the source-drain 90 and the gate 88 are provided with aluminum electrodes to obtain a complete device. The buried oxide layer 85 is accordance with the buried oxide layer 32 in the FIG. 6. The substrate 81 and the gradient composition layer 82 is accordance with the substrate 31 in the FIG. 6.

Since an MOSFET produced as described above employs as a channel a strained Si layer, it serves as a high performance device.

Since the invention provides a thin lattice-relaxed SiGe layer regardless of the critical film thickness for the lattice relaxation when an SiGe layer is formed on an Si crystal, an extremely thin relaxed SiGe, whose thickness is equal to or less than the critical layer thickness of the SiGe layer on the Si crystal, can be obtained in a multilayer structure of a strained Si/relaxed SiGe/insulating layers.

Also lattice-relaxation SiGe layer on which the strain Si layer formed is so thin that it is easy to separate devices each other.

Also since it hydrogen-terminates the lattice-relaxed SiGe layer or it forms the oxide layer on the surface of the lattice-relaxed SiGe layer, and it etches the surface, and then it re-grows the strained Si layer on the surface, the interface characteristics between the strained Si layer and the lattice-relaxed SiGe layer becomes more satisfactory and the device performance can be improved.

What is claimed is:

1. A method of producing a semiconductor device comprising the steps of:
   forming a strained SiGe layer on a substrate;
   introducing oxygen into said strained SiGe layer;
   forming an oxide layer by a heat treatment at the position where the oxygen is introduced, so as to make a lattice-relaxed SiGe layer on said oxide layer; and
   growing a strained Si layer over said lattice-relaxed SiGe layer.

2. A method of producing a semiconductor device according to claim 1 further comprising a step of forming a Si cap layer over said strained SiGe layer, wherein the surface of said strained SiGe layer is protected during said heat treatment.

3. A method of producing a semiconductor device according to claim 1 further comprising a step of growing an SiGe growing layer over said lattice-relaxed SiGe layer, and then growing said strained Si layer over said SiGe growing layer.

4. A method of producing a semiconductor device according to claim 1 further comprising a step of etching the surface of said lattice-relaxed SiGe layer, and then growing said strained Si layer.

5. A method of producing a semiconductor device according to claim 1, wherein said oxide layer divides said strained SiGe layer into a SiGe upper layer that formed over said oxide layer and a SiGe lower layer that formed under said oxide layer.

6. A method of producing a semiconductor device according to claim 1, wherein oxygen is introduced by an oxygen ion implantation under a condition that the oxygen ion is in said strained SiGe layer.

7. A method of producing a semiconductor device according to claim 1 further comprising an HF treatment for terminating the surface of said lattice-relaxed SiGe layer by hydrogen, and then growing said strained Si layer.

8. A method of producing a semiconductor device according to claim 7 wherein said hydrogen on the surface of said lattice-relaxed SiGe layer is removed by a heat treatment, and then growing said strained Si layer.

9. A method of producing a semiconductor device according to claim 1 further comprising the steps of forming an oxide layer on the surface of said lattice-relaxed SiGe layer and removing said oxide layer by a heat treatment under vacuum, and then growing said strained Si layer.

10. A method of producing a semiconductor device according to claim 1 further comprising a step of forming a SiGe buffer layer on said substrate, and then forming said strained SiGe layer on said SiGe buffer layer.

11. A method of producing a semiconductor device according to claim 1, wherein said substrate is a Si substrate.

12. A method of producing a semiconductor device according to claim 1, wherein said substrate is a silicon-on-insulator substrate.

13. A method of producing a semiconductor device comprising the steps of:
    forming a lattice-relaxed SiGe layer on an insulating layer;
    a HF treatment for terminating the surface of said lattice-relaxed SiGe layer by hydrogen; and
    growing a strained Si layer over the surface of said lattice-relaxed SiGe layer.

14. A method of producing a semiconductor device according to claim 13 further comprising a step of removing a part of the surface of said lattice-relaxed SiGe layer, and then terminating said the surface of said lattice-relaxed SiGe layer.

15. A method of producing a semiconductor device according to claim 13 further comprising a step of removing said hydrogen on the surface of said lattice-relaxed SiGe layer by a heat treatment, and then growing said strained Si layer.

16. A method of producing a semiconductor device according to claim 13 further comprising a step of growing a SiGe growing layer on said lattice-relaxed SiGe layer, and then growing said strained Si layer on said SiGe growing layer.

17. A method of producing a semiconductor device comprising the steps of:
    forming a lattice-relaxed SiGe layer on an insulating layer;
    forming an oxide layer on the surface of said lattice-relaxed SiGe layer;

removing said oxide layer by a heat treatment under vacuum; and growing a strained Si layer on the surface of said lattice-relaxed SiGe layer.

18. A method of producing a semiconductor device according to claim 17 further comprising a step of removing a part of the surface of said lattice-relaxed SiGe layer, and then forming said oxide layer on the surface of said lattice-relaxed SiGe layer.

19. A method of producing a semiconductor device according to claim 17 further comprising a step of growing a SiGe growing layer on said lattice-relaxed SiGe layer after removing said oxide layer, and then growing said strained Si layer on said SiGe growing layer.

20. A semiconductor device comprising:

a substrate;

a first SiGe layer formed on the substrate;

an oxide layer formed on said first SiGe layer;

a second SiGe layer formed on said oxide layer, wherein said second SiGe layer is lattice-relaxed and has a thickness of 200 nm or less;

a strained Si layer formed on said second SiGe layer.

21. A semiconductor device according to claim 20, wherein said second SiGe layer has a thickness of 20 nm or less.

* * * * *